United States Patent
Kim

(10) Patent No.: US 8,324,573 B2
(45) Date of Patent: Dec. 4, 2012

(54) DETECTOR FOR ELECTRON COLUMN AND METHOD FOR DETECTING ELECTRONS FOR ELECTRON COLUMN

(76) Inventor: Ho Seob Kim, Incheon (KR)

( * ) Notice: Subject to any disclaimer, the term of this patent is extended or adjusted under 35 U.S.C. 154(b) by 344 days.

(21) Appl. No.: 12/064,071

(22) PCT Filed: Aug. 18, 2006

(86) PCT No.: PCT/KR2006/003265
§ 371 (c)(1), (2), (4) Date: Feb. 18, 2008

(87) PCT Pub. No.: WO2007/021163
PCT Pub. Date: Feb. 22, 2007

(65) Prior Publication Data
US 2009/0014650 A1    Jan. 15, 2009

(30) Foreign Application Priority Data
Aug. 18, 2005  (KR) .................. 10-2005-0075519

(51) Int. Cl.
*G01N 23/00* (2006.01)
*G21K 7/00* (2006.01)

(52) U.S. Cl. ..... 250/310; 250/311; 250/307; 250/396 R; 250/492.2; 250/492.1; 250/397

(58) Field of Classification Search .......... 250/310, 250/311, 307, 396 R, 492.2, 492.1, 397
See application file for complete search history.

(56) References Cited

U.S. PATENT DOCUMENTS

| | | | |
|---|---|---|---|
| 5,412,211 A | | 5/1995 | Knowles |
| 5,644,128 A | | 7/1997 | Wollnik et al. |
| 5,894,124 A | * | 4/1999 | Iwabuchi et al. ............. 250/310 |
| 5,945,672 A | * | 8/1999 | Knowles et al. ............. 250/310 |
| 6,130,429 A | * | 10/2000 | Ambe et al. .................. 250/310 |
| 7,109,486 B1 | * | 9/2006 | Spallas et al. ................ 250/311 |

(Continued)

FOREIGN PATENT DOCUMENTS
EP  A 1 162 645  12/2001
(Continued)

OTHER PUBLICATIONS

"A position- and time-sensitive particle detector with subnanosecond time resolution" S. Rosen, R. Pervall, J. ter Horst, G. Sundstrom, J. Semaniak, O. Sundqvist, M. Larrson, M. de Wilde and W.J. vander Zande, Hyperfine Interactions vol. 115, 1998, pp. 201 to 208.*

(Continued)

*Primary Examiner* — Jack Berman
*Assistant Examiner* — Meenakshi S Sahu
(74) *Attorney, Agent, or Firm* — John K. Park; Park Law Firm

(57) ABSTRACT

In a conventional micro-channel plate (MCP), a secondary electron (SE) detector or a semi-conductor detector the number of the electrons is amplified through its own structure. For such amplification a small voltage difference is applied externally or generated due to its own structure and material. The electric current of electrons undergoing the above-described procedure is amplified by an external amplification circuit. In the present invention electrons—resulting from the collision of the electron beam generated by a microcolumn—are detected by surrounding conductive wiring. The detected electrons are amplified using an amplification circuit on the outside similar to a conventional detection method.

12 Claims, 3 Drawing Sheets

U.S. PATENT DOCUMENTS

| 2002/0153483 A1 | 10/2002 | Parker et al. |
|---|---|---|
| 2002/0166966 A1 | 11/2002 | Ogawa |

FOREIGN PATENT DOCUMENTS

| JP | 02-132745 A | 5/1990 |
|---|---|---|
| JP | 10 188883 A | 7/1998 |
| WO | WO 00/31769 | 6/2000 |
| WO | WO 00/31769 A2 | 6/2000 |
| WO | WO 01/09916 A1 | 2/2001 |
| WO | WO 03/034462 A1 | 4/2003 |
| WO | WO 03/34462 A1 | 4/2003 |

OTHER PUBLICATIONS

Danilatos GD, "Design and Construction of an Environmental Sem (Part 4)," Scanning, Foundation for Advances in Medicine and Science, Jan. 1, 1990, pp. 23-27, vol. 12/No. 1.

* cited by examiner

DETECTOR FOR ELECTRON COLUMN AND METHOD FOR DETECTING ELECTRONS FOR ELECTRON COLUMN

TECHNICAL FIELD

The present invention relates generally to a detector used in an electron column system and, more particularly, to a detector which easily detects electrons and secondary electrons resulting from the collision of an electron beam generated by an electron column with a sample, and a method of easily performing detection using the electron column.

BACKGROUND ART

Conventionally, electrons generated by an electron microscope or an electron beam generator hit a sample where they either induce the reflection of the electron or the emission of secondary electrons. All electrons can be detected by a conventional micro-channel plate detector (MCP), a secondary electron (SE) detector or a semi-conductor detector. When electrons enter these detectors (system) the number of electrons is multiplied through their own structure. For such amplification, a some voltage is applied to a detector or a potential difference generated due to their structure and material is produced. The electric current generated by the electrons undergoing the procedure in above-described detector is amplified by an external amplification circuit.

Referring to FIG. 1, an electron beam B emitted from an electron beam generator 100 is projected onto a sample. A conventional detector 10 detects electrons 9 either from the collision of the electron beam B with the sample or secondary electrons emitted from the sample. The electrons 9 are emitted or bounced from the sample—as indicated by arrows and dots—and are then detected by the detector 10.

However a conventional detector 10 uses a method for performing amplification to collect data using electrons resulting from the collision of the electron beam with the sample or secondary electrons. The number of electrons resulting from the collision of the electron beam B with the sample and the number of secondary electrons, generated by a conventional electron beam generator, is small. The electric current from these detected electrons has to be amplified before usage. In an electron beam generator such as an electron microscope with high energy or a conventional electron beam generator with low energy typical value for the electric current range from Pico ampere to more than hundreds of Pico amperes depending on the application conditions. Therefore, such a detector (detecting system) is configured to immediately multiply the number of collected electrons. For example, a Micro Channel Plate (MCP) or a Back Scattering Electron Detector (BSED) using a P-N junction has been used.

The recent development of an electron beam emission source, such as a micro-column, generates an electron beam with a much higher current at low energy. The number of electrons reaching and interacting with the sample is in the range from hundreds of Pico amperes to Nanoamperes. Compared to a conventional electron column these currents can easily be detected.

DISCLOSURE OF INVENTION

Technical Problem

The present invention has been made keeping the above occurring problems in mind. The objective of the present invention is to provide a cost efficient detector, which is simple in structure and the convenient in usage.

Another objective of the present invention is to provide a method of simply detecting electrons by using an electron column.

Technical Solution

In order to accomplish the above objectives, a detector for an electron column according to the present invention is made of conductive material in a mesh form. This structure is made from an arrangement of one or more wired arrangements or a conductive plate, so that the electron column is placed on a sample and then used.

In order to accomplish the above objectives, the method of detecting electrons according to the present invention can perform detection using the above detector or checking sample current using the conductive part of a sample.

The method of detecting electrons generated by an electron beam in a column according to the present invention is characterized in that a detector directly detects the electrons and provides the electric current as data about the detected electrons to the outside.

In contrast to a conventional electron beam generator, the number of electrons emitted from the source onto a sample by a micro-column is relatively high and hence the number of electrons reflected back from the sample or produced by the emission of secondary electrons is relatively high. Electric currents between about 0.5 nA and several Nanoamperes are measured. Therefore, a reliable detector with a simple structure is used instead of the conventional detector with more a complicated structure. The structure of the detector according to the present invention can be patterned as conductive wiring. The conductive wiring is characterized in that it performs the role of a conventional detector even if the conductive wiring on a path, which does not obstruct the path of the electron beam from the micro-column, is used and it is connected to an external amplifier or a control device.

Furthermore, the detection method according to the present invention detects using the detector according to the present invention or utilizes a sample current method. In the detection method according to the present invention the detector is located around a sample and electrons from the sample are detected by the detector, or performing wiring on a sample as the sample current method and directly detecting electrons from the sample using a wire without a separate detector.

Advantageous Effects

The detector according to the present invention has a simple structure, since in the detector the structure or processing for multiplying the number of electrons detected is not required, and the manufacturing cost are inexpensive compared to a conventional detector. Furthermore, the detecting method according to the present invention easily detects electrons using the detector according to the present invention or a sample current method.

MODE FOR THE INVENTION

A detector according to the present invention is described below in detail with reference to the drawings.

Figure 1:
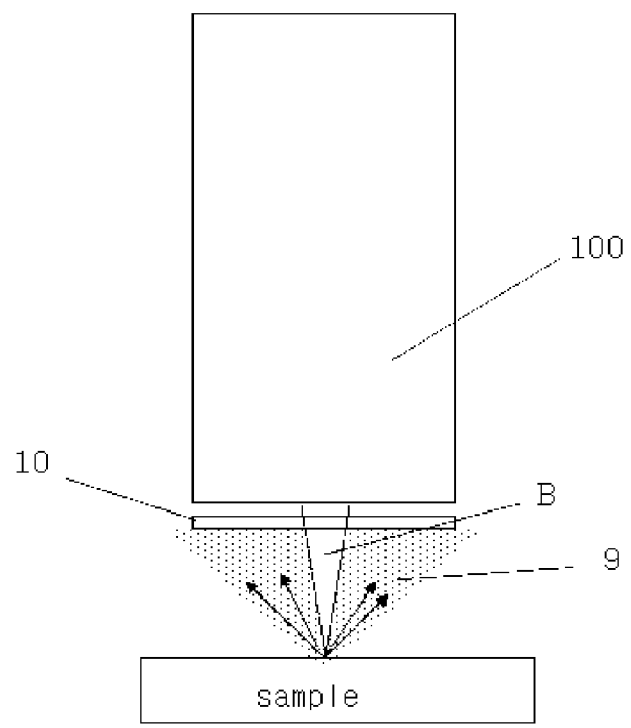
FIG. 1 is a schematic sectional view illustrating the detection of electrons in a conventional micro-column.
Figure 2:
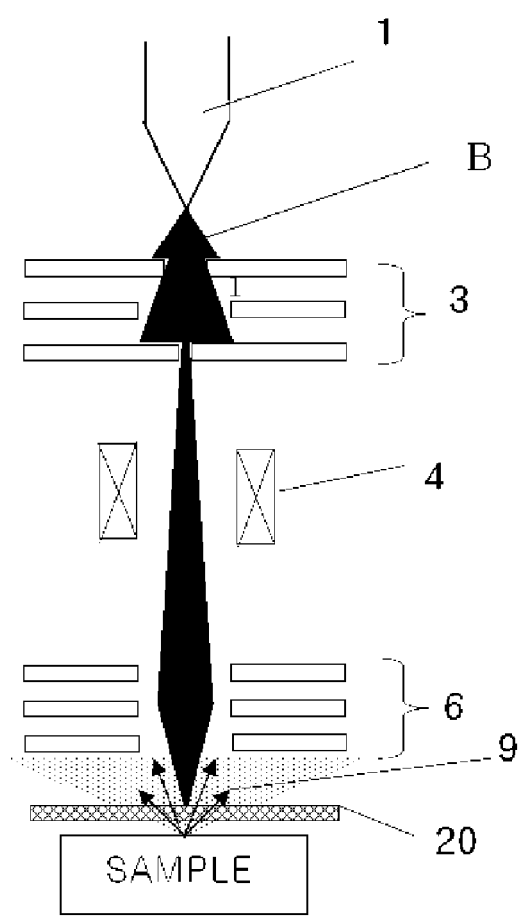
FIG. 2 is a schematic sectional view illustrating the use of a detector as an example of the present invention.

FIG. 2 is a schematic sectional view schematically illustrating the use of a detector, which is an example of the present invention. Electrons emitted from an electron emission source 1 are converted into an electron beam B with a shape given by source lens 3, then deviated by a deflector and finally focused on a sample by a focus lens 6. A detector 20 detects electrons resulting from the collision of the electron beam with the sample as well as secondary electrons from the sample. While the electrons are moving (indicated by arrows) from the sample, the electric current—produced by the electrons 9 hitting the detector (indicated by dots)—is analyzed. This results in data about the sample.

Figure 3:
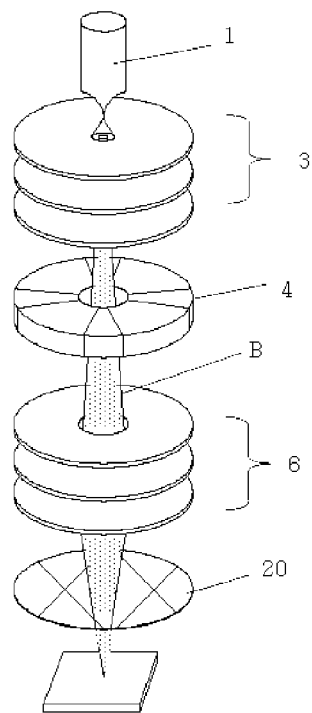
FIG. 3 is a schematic perspective view illustrating detection using the detector according to the present invention.

FIG. 3 is a schematic perspective view illustrating the detection using detector according to the present invention, which illustrates the arrival of the electron beam B to the sample through the inner space of the detector 20 in the sectional view of FIG. 2. In FIG. 3, the detector 20 is constructed by crossing four conductive wires and the electron beam B is radiated through a space between the conductive wires.

Figure 4:
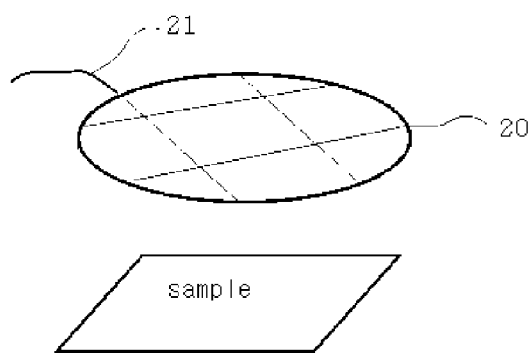
FIG. 4 is a schematic perspective view illustrating positioning of the detector of the present invention above a sample.

FIG. 4 is a schematic perspective view illustrating the positioning of the detector of the present invention above a sample. The figure shows the detector as a mesh formed by wires. The size of each mesh space is larger than the width of the electron beam B. In this case the four wires cross each other and the electron beam passes through a mesh space and is emitted onto the sample. The detector 20 is connected to an external controller via a detector wire 21.

The detector according to the present invention is connected by a conductive wire to a controller such as a detector amplifier. It collects electrons resulting from the reflection of an electron beam from a sample or of secondary electrons from the sample, and transmits the signal to an amplification circuit or a controller.

The simplest detector structure is a single conductive wire located close to the area to be scanned and moved when the scan area is moved.

With increasing number of conductive wires, the detection efficiency increases. For example, when a grid of conductive wires is located over a scan area the detection of electrons is more effective than with just a single wire. In this case the number of electrons from the sample hitting the grid of conductive wires is much increased in comparison to the single wire. It only has to be ensuring that the grid of conductive wires does not obstruct the path of the electron beam passing through. That is, the grid-patterned conductive wires can be used if the number of electrons detected from an electron beam is large regardless of the sample, and thus the detection of electrons from the sample is not obstructed. Nonetheless, if the scan range of the electron beam is broader than the sensitive area of the detector, the possibility that the detector interferes with the electron beam increases since the detector may overlap the scan range of the electron beam. This can be checked by conducting an image test using a test sample. In FIG. 3, the image of the test sample has been previously acquired by the detector of the present invention. The original image is then compared with the image of the detector test. Furthermore, the analysis of the measured electric current of the test sample can perform inspection similar to the image test. A method for analyzing the electric current acquired by the detector and comparing it with the current data of the test sample may be used. If the detector obstructs the image of the sample, the sample or the detector is moved and the image or the current data can be checked.

The detector according to the present invention may be formed of conductive wires as described above or may have a structure like a grid mesh shape. It is also possible to form the conductive wires into a planar structure with a circular or a polygonal shape. If required it is possible to form the conductive wires into a three-dimensional shape (for example a pyramid or a cone-shaped structure). It is also possible to use a conductive plate instead of conductive wiring and arrange it in a way so that the conductive plate does not interfere with the projection of the electron beam onto a desired area on the sample, thereby using it as a detector.

The method of detecting electrons in an electronic column according to the present invention is conducted by performing the wiring to the outside, amplifying the electric current, and analyzing the information about the image or other samples by checking the amplified values and the variation thereof.

In comparison to a conventional detector with a specially shaped structure to which a voltage is applied to the detector and the detector multiplies electrons (increases the number of electrons) and acquires information from detected electrons, the detector of the present invention requires only wiring, and analyzes electrons (current value and variation thereof) detected through the wiring, thereby analyzing data.

Another method of detecting electrons in an electronic column system according to the present invention is to perform detection using the wiring of a sample through a conventional sample current method without using a separate detector. The sample current method is to arrange wiring on a sample, amplify the number of electrons detected through the wiring with an extra amplifier, and analyze information related to the detected electrons. This concept pertains to a method of arranging wiring on part of the sample and then performing detection, rather than arranging wiring on the entire sample.

Figure 5:
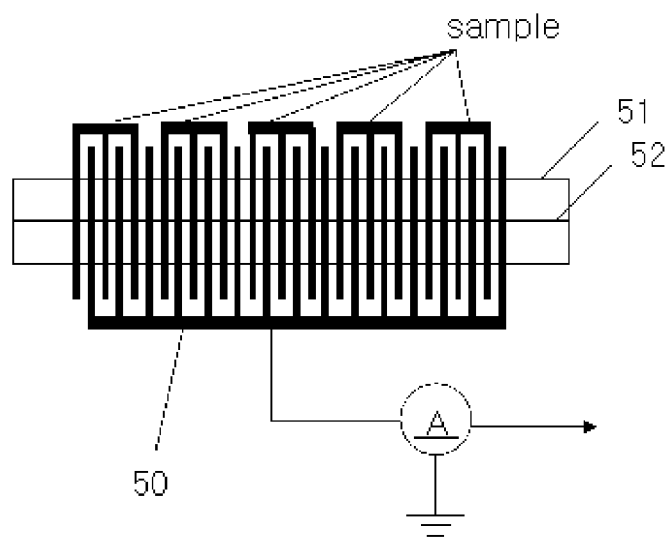
FIG. 5 is a diagram conceptually illustrating the arrangement of wires using the concept of a sample current method which can be used in the detection method according to the present invention.

FIG. 5 is a diagram illustrating the concept and arrangement of a method of performing detection using the sample current method.

As illustrated in FIG. 5, in the case where the arrangement of wiring is known for example, the internal wiring of a semiconductor, the adjacent data lines or gate lines of a Thin Film Transistor (TFT) in a TFT-LCD, or a display with wires arranged cross to each other—the present invention utilizes any piece of wiring as conducting wires of a detector.

In FIG. 5 a wire 50 passing closely to an examined sample is used as a detector (part). The wire 50 is connected to an ampere meter A that can analyze the current—such as the intensity of detected current—thereby analyzing and utilizing this data. When an electron beam scans a predetermined scan area 51 a related image is generated as represented in FIG. 6.

Figure 7:
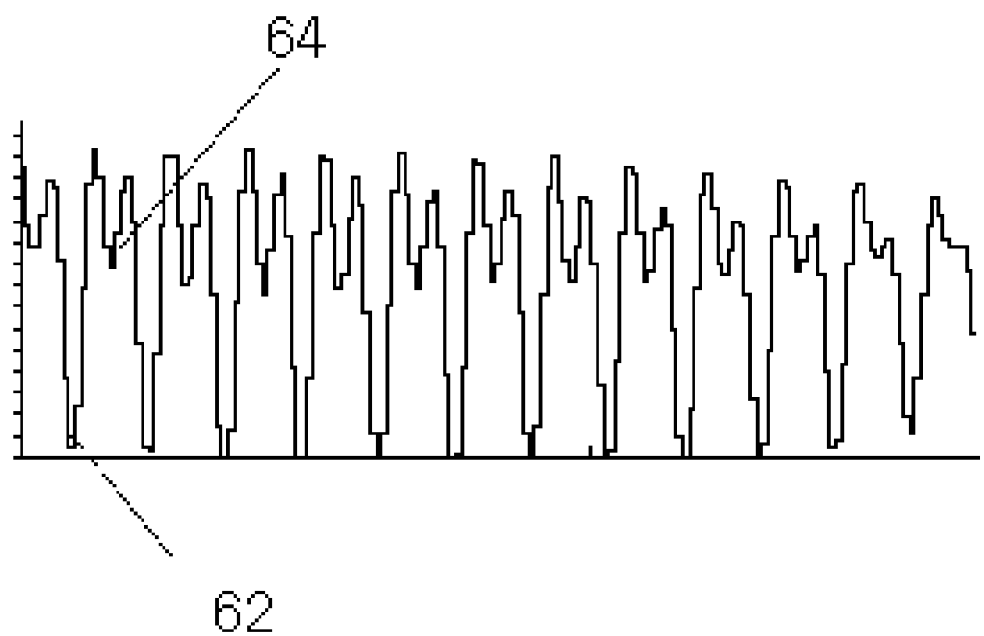
FIG. 7 is a diagram illustrating the current intensity data of the results of detection using the sample current method of FIG. 5.

Furthermore, the current intensity is represented as in FIG. 7 when the electron beam performs line-scanning as in a scan line 52.

When the sample is a grounded conductor, the electrons are detected well without the discharge of electrons due to the electron beam If a negative voltage is applied to the sample from the outside, the detection is performed better. If the sample is not a conductor, detection is still possible but charging effects occur. Thus to minimize charging effects it is preferable to perform scans without exposing same part of the sample several times.

Figure 6:
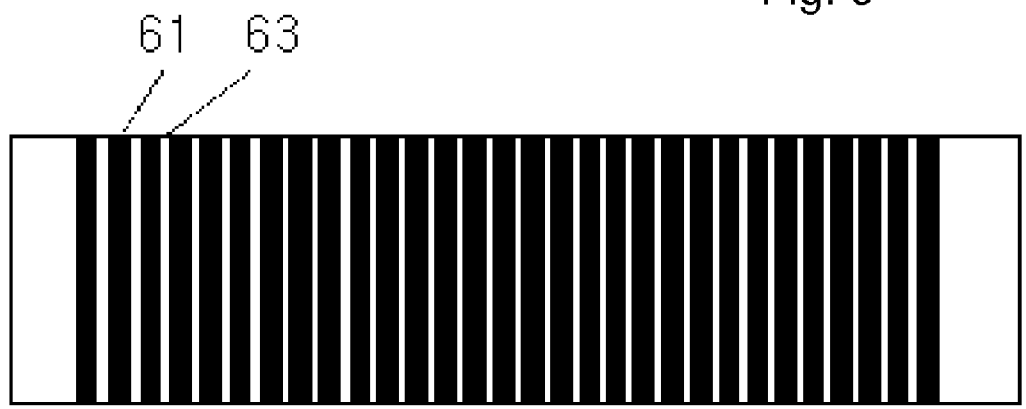
FIG. 6 is a schematic diagram illustrating the resulting image of the detection using the sample current method of FIG. 5.

As the results of the detection in FIG. 5, a detected image is represented using the sample current method as in FIG. 6, and current intensity data is acquired as in FIG. 7. The image of FIG. 6 has been edited and then illustrated for convenience of viewing. The current data of FIG. 7 is actual data. The examination areas chiefly include downward partial peak parts 64, and the current values at the detector represent lower peak parts 62.

In FIG. 6, block bar 61 designates the conductive part of the detector shown in FIG. 5, and block bars 63 designates a bar which is a target to be detected. In FIG. 6, although block bars 61 and 63 may be considered similar in brightness, the area of the detector is more clearly viewed in an actual image and the image of the area of the sample to be detected is less clearly viewed than the area of the detector. This is known from the current data of FIG. 7. Block bar 61 corresponds to the detector, represents the current data of lower peak parts 62 and the block bar 63 corresponding to the sample represents upper peak parts 64. Since the number of electrons radiated onto the sample area is lower than the number of electrons radiated directly onto the detector itself, the images is lower bright and the current data value is lower. In FIG. 7, because electrons have negative charges, the current value of the lower portion is higher than that of the upper portion, which means that more electrons are detected in the lower portion.

Therefore electrons from the electron beam emitted onto and reflected by a conductor around a detection area or secondary electrons are detected by the conducting parts of the sample. An image or electric current data can be acquired from the sample using the sample current method without using a separate detector. When a negative voltage is applied to the sample parts in the example of FIG. 5, more emitted electrons are detected by the detector, providing a clearer image or a higher electric current further improving the analysis. If a negative voltage is applied to the sample parts the electrons from the column are reflected from the sample parts towards the detector part and are detected more easily by the detector part.

If the sample part in FIG. 5 is not a conductor and is cut when the electron beam performs scanning, the electrons emitted from the electron beam are charged at ends spaced apart from each other, so that the charged electrons at ends spaced apart are analyzed as current data, and the sample part is thereby examined.

If the sample in the case of FIG. 5 is a conductor, the examination (sample) area and the detection area are exchanged and then detection can be performed. The results of the detection are identical to the case mentioned above.

Although a single-type electron column is described, a multi-type electron column can utilize the detector and the detection method according to the present invention.

In the multi-type electron column many electron column units—each is a single-type electron column—may be arranged in an n×m matrix and then be used, or may be used in a wafer form. Although single electron columns can have each a detector in entire columns with 1:1 correspondence, the single columns are sequentially used and detection is performed if one detector according to the present invention is used for several columns. When the single columns are operated at specific time intervals, data can be detected only sequentially. If one detector is used for several columns, the detector may be broadly arranged above the sample. If the detector uses a wire type setup, the wire is broadly arranged above the sample. In particular, when detection is performed using conductive wires within a sample, detection can be performed by the sequential operation of respective unit single columns operated rather than specific detection.

INDUSTRIAL APPLICABILITY

The detector and detection method according to the present invention can be used in all fields using an electron column. The detector and detection method according to the present invention can be used in all applications that use an electron column, such as an electron microscope, an examination device using an electron beam, and a lithography device using an electron beam.

The invention claimed is:

1. A detector for an electron column, which is made of conductive material in a mesh form, made from an arrangement of one or more conductive wires, or a conductive plate shape, and which is located and used directly above a sample, wherein the detector directly receives and transmits electrons generated by an electron beam in an electron column to an outside without amplifying the detected electrons, as a transmission of data about the electric current, and wherein the electron beam is radiated through a space between the conductive wires.

2. The detector as set forth in claim 1, wherein the detector has a two-dimensional or three-dimensional structure formed of one conductive wire.

3. A method of detecting electrons generated by an electron beam in an electron column, the method comprising steps for:
   receiving directly electrons generated by an electron beam in an electron column, and
   transmitting the electrons directly to an outside, as a transmission of data about the electric current, without amplifying the detected electrons.

4. The method as set forth in claim 3, wherein the detector comprises a detector for an electron column, which is made of conductive material in a mesh form, made from an arrangement of one or more conductive wires, or a conductive plate shape, and which is located and used directly above a sample.

5. The method as set forth in claim 3, wherein the detector is wired through a conductive part of a sample using a sample current method and performs detection.

6. The method as set forth in claim 5, wherein the detection is performed by applying negative voltage to the sample.

7. The method as set forth in claim 3, wherein the detector detects electrons from electron beams which are generated by a plurality of electron columns, and the detector performs detection while the electron columns are sequentially operated.

8. The method as set forth in claim 3, wherein the detector comprises a detector for an electron column, which is made of conductive material in a mesh form, made from an arrangement of one or more conductive wires, or a conductive plate shape, and which is located and used directly above a sample, and wherein the detector has a two-dimensional or three-dimensional structure formed of one conductive wire.

9. The method as set forth in claim 4, wherein the detector detects electrons from electron beams which are generated by a plurality of electron columns, and the detector performs detection while the electron columns are sequentially operated.

10. The method as set forth in claim 5, wherein the detector detects electrons from electron beams which are generated by a plurality of electron columns, and the detector performs detection while the electron columns are sequentially operated.

11. The method as set forth in claim 6, wherein the detector detects electrons from electron beams which are generated by a plurality of electron columns, and the detector performs detection while the electron columns are sequentially operated.

12. The method as set forth in claim 8, wherein the detector detects electrons from electron beams which are generated by a plurality of electron columns, and the detector performs detection while the electron columns are sequentially operated.

* * * * *